(12) United States Patent
Kogure

(10) Patent No.: US 10,524,353 B2
(45) Date of Patent: Dec. 31, 2019

(54) CIRCUIT BOARD

(71) Applicant: Murata Manufacturing Co., Ltd., Kyoto (JP)

(72) Inventor: Takeshi Kogure, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/966,227

(22) Filed: Apr. 30, 2018

(65) Prior Publication Data

US 2018/0249575 A1   Aug. 30, 2018

Related U.S. Application Data

(63) Continuation of application No. PCT/JP2016/080811, filed on Oct. 18, 2016.

(30) Foreign Application Priority Data

Nov. 4, 2015   (JP) .................................. 2015-217129

(51) Int. Cl.
*H05K 1/02* (2006.01)
*H05K 3/46* (2006.01)
(Continued)

(52) U.S. Cl.
CPC ......... *H05K 1/0237* (2013.01); *H03H 7/0138* (2013.01); *H05K 1/0215* (2013.01);
(Continued)

(58) Field of Classification Search
CPC .. H05K 1/0237; H05K 1/0215; H05K 1/0224; H05K 1/115; H05K 3/46; H03H 7/0138
(Continued)

(56) References Cited

U.S. PATENT DOCUMENTS

2013/0278350 A1   10/2013   Takeuchi
2014/0179364 A1   6/2014   Kitajima

FOREIGN PATENT DOCUMENTS

JP    H10-135704 A    5/1998
JP    H11-330298 A    11/1999
(Continued)

OTHER PUBLICATIONS

International Search Report for International Application No. PCT/JP2016/080811, dated Jan. 10, 2017.
(Continued)

*Primary Examiner* — Tremesha S Willis
(74) *Attorney, Agent, or Firm* — Pearne & Gordon LLP

(57) ABSTRACT

To enhance the isolation between signal lines for transmitting high-frequency signals included in a circuit board. A circuit board includes a plurality of signal lines for transmitting high-frequency signals, a ground electrode positioned between the plurality of signal lines and spaced apart from each of the plurality of signal lines, and a plurality of via conductors connected to the ground electrode. When the circuit board is seen in plan view, the ground electrode has a protruded and recessed area in at least a section of an outer edge thereof, the protruded and recessed area outwardly protruded and inwardly recessed. The plurality of via conductors is positioned in the protruded and recessed area so as to match with a protruded and recessed shape of the protruded and recessed area.

23 Claims, 4 Drawing Sheets

(51) Int. Cl.
  *H03H 7/01* (2006.01)
  *H05K 1/11* (2006.01)
(52) U.S. Cl.
  CPC .......... *H05K 1/0224* (2013.01); *H05K 1/115* (2013.01); *H05K 3/46* (2013.01); *H05K 2201/09609* (2013.01)
(58) Field of Classification Search
  USPC ........................................................ 174/262
  See application file for complete search history.

(56) References Cited

FOREIGN PATENT DOCUMENTS

| | | |
|---|---|---|
| JP | 2005-217581 A | 8/2005 |
| WO | 2011/136100 A1 | 11/2011 |
| WO | 2012/176401 A1 | 12/2012 |

OTHER PUBLICATIONS

Written Opinion for International Application No. PCT/JP2016/080811, dated Jan. 10, 2017.

FIG. 1 PRIOR ART
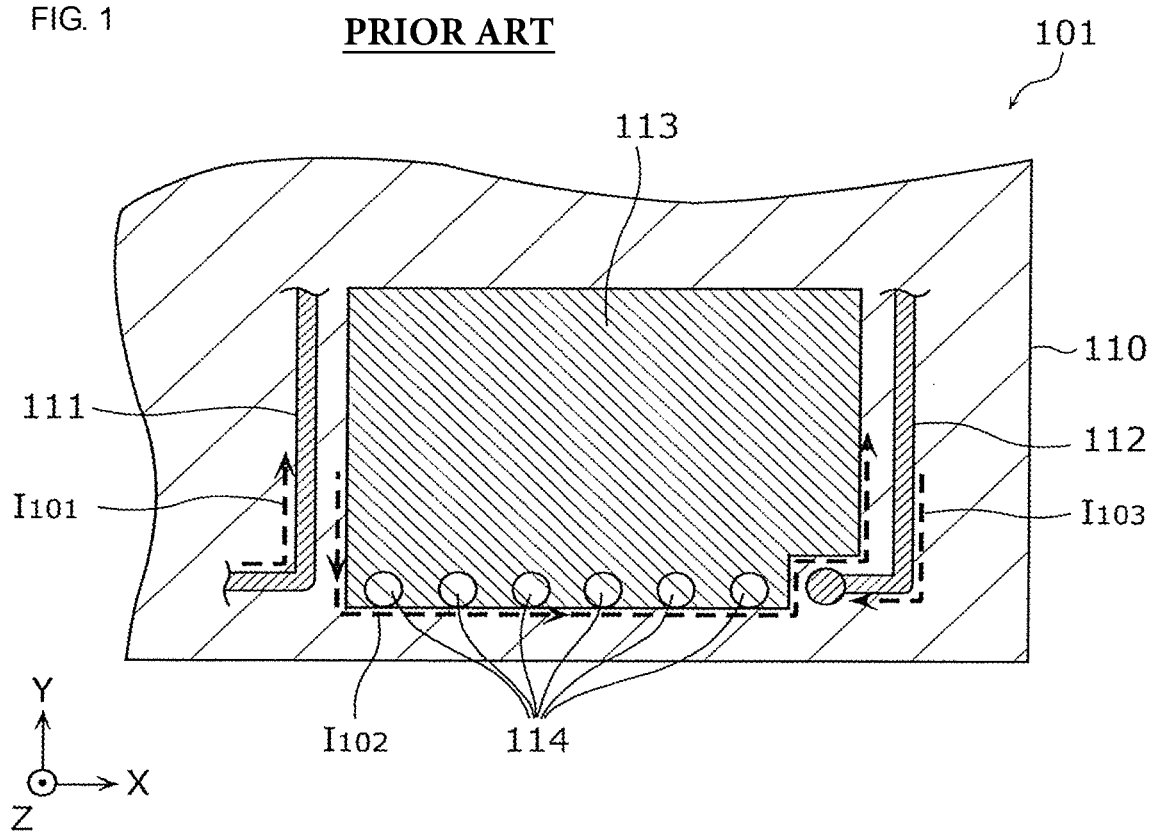
FIG. 2
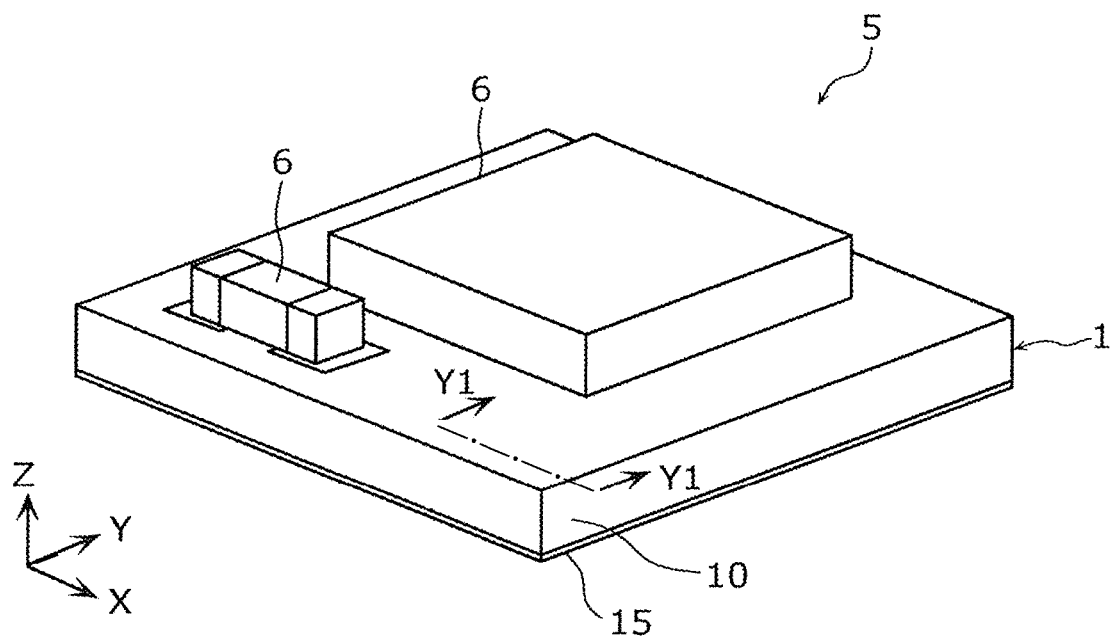

CIRCUIT BOARD

This is a continuation of International Application No. PCT/JP2016/080811 filed on Oct. 18, 2016 which claims priority from Japanese Patent Application No. 2015-217129 filed on Nov. 4, 2015. The contents of these applications are incorporated herein by reference in their entireties.

BACKGROUND

Technical Field

The present disclosure relates to circuit boards and in particular to a circuit board with a signal line for transmitting high-frequency signals.

A cellular phone or mobile information terminal incorporates a high-frequency module on which various chip components, a filter, a semiconductor element, and other elements are mounted. The high-frequency module includes a circuit board as a portion thereof, and the circuit board is equipped with signal lines for transmitting high-frequency signals (for example, Patent Document 1).

The circuit board described in Patent Document 1 includes a transmission electrode and a reception electrode which are signal lines. A ground electrode is disposed between the transmission electrode and reception electrode, and a plurality of via conductors is disposed so as to overlap an end edge of the ground electrode.

Patent Document 1: International Publication No. 2012-176401

BRIEF SUMMARY

With increasingly higher degrees of integration of the circuit board, the circuit board in the related art has a problem described below. FIG. 1 is a plan view of a portion of a circuit board 101 in a comparative example for describing the problem in the related art.

The circuit board 101 in the comparative example includes a board body 110, two signal lines 111 and 112 for transmitting high-frequency signals, a ground electrode 113 disposed between the two signal lines 111 and 112, and a plurality of via conductors 114 connected to the ground electrode 113.

The ground electrode 113 is a conductor having a substantially rectangular shape and is spaced apart from each of the opposed signal lines 111 and 112.

The via conductors 114 are cylindrical interlayer conductors. Ends of the via conductors 114 are arranged along one side of the outer edge of the ground electrode 113 and connected to the ground electrode 113. Other ends of the via conductors 114 are grounded in a depth direction (in a direction perpendicular to an extending surface of the ground electrode 113) in the drawing (illustration is omitted).

In the circuit board 101 having the above-described structure, for example, when a current $I_{101}$ based on a high-frequency signal flows in the signal line 111, an excitation current $I_{102}$ flows along the edge of the ground electrode 113. The excitation current $I_{102}$ causes an excitation current $I_{103}$ to flow in the other signal line 112.

In the circuit board 101 in the comparative example, in order to suppress propagation of the excitation current $I_{102}$, the ground electrode 113 is connected to the plurality of via conductors 114, and thus the excitation current $I_{102}$ partly escapes toward the grounding side. This structure enhances the isolation between the signal lines 111 and 112.

With increasingly higher degrees of integration of the circuit board 101, there is a need for more enhanced isolation between the two signal lines 111 and 112. Unfortunately, however, the circuit board having the structure illustrated in the comparative example or related art suppresses the propagation of the excitation current $I_{102}$ insufficiently. Thus, it is difficult to achieve a high degree of the isolation between the signal lines 111 and 112.

The present disclosure provides a circuit board that includes a plurality of signal lines for transmitting high-frequency signals and that achieves enhanced isolation between the signal lines.

A circuit board according to one aspect of the present disclosure includes a plurality of signal lines for transmitting high-frequency signals, a ground electrode positioned between the plurality of signal lines and spaced apart from each of the plurality of signal lines, and a plurality of via conductors connected to the ground electrode. When the circuit board is seen in plan view, the ground electrode has a protruded and recessed area (convex and concave area) in at least a section of an outer edge thereof, the protruded and recessed area outwardly protruded and inwardly recessed. The plurality of via conductors is positioned in the protruded and recessed area so as to match with a protruded and recessed shape of the protruded and recessed area.

As described above, because the ground electrode has the protruded and recessed area in its outer edge, the length of the edge of the ground electrode is increased. Thus, the length of the current path of an excitation current in the ground electrode occurring with the current in one signal line of the plurality of signal lines is increased. Therefore, the excitation current flowing in the ground electrode can be reduced, and an excitation current occurring in the other signal line can also be reduced. Because the via conductors are disposed so as to match with the protruded and recessed shape of the protruded and recessed area, the section of the edge of the ground electrode close to the via conductors is increased. Thus, the current can escape from the current path of the excitation current through the via conductors, the excitation current flowing in the ground electrode can be reduced, and the excitation current occurring in the other signal line can be reduced. Accordingly, the isolation between the one signal line and the other can be enhanced.

The plurality of via conductors may include via conductors positioned inside protruded (convex) portions of the protruded and recessed area and via conductors positioned inwardly from recessed (concave) portions thereof, as seen in plan view.

With this configuration, the length of the path close to the via conductors in the current path of the excitation current flowing in the ground electrode can be increased. Thus, the current can escape through the via conductors, the excitation current flowing in the ground electrode can be reduced, and the excitation current occurring in the other signal line can be reduced. Accordingly, the isolation between the signal lines can be enhanced.

The plurality of via conductors may further include via conductors positioned inwardly from the protruded portions, as seen in plan view.

With this configuration, the section close to the via conductors of the current path of the excitation current flowing in the ground electrode can be increased, and the length of the path close to the via conductors can be further increased. Thus, the current can escape through the via conductors, the excitation current flowing in the ground electrode can be reduced, and the excitation current occurring in the signal line can be reduced. Accordingly, the isolation between the signal lines can be enhanced.

The plurality of via conductors may be arranged in a plurality of rows along the outer edge of the ground electrode.

With this configuration, the length of the path close to the via conductors aligned in a plurality of rows in the current path of the excitation current flowing in the ground electrode can be further increased. Thus, the current can escape through the via conductors, the excitation current flowing in the ground electrode can be reduced, and the excitation current occurring in the signal line can be reduced. Accordingly, the isolation between the signal lines can be enhanced.

The protruded portions and the recessed portions of the protruded and recessed area in the ground electrode may be alternately arranged at the same pitch.

With this configuration, the excitation current can be appropriately dispersed and reduced.

The plurality of signal lines may be opposed in a predetermined plane, and the protruded and recessed area in the ground electrode may be positioned in a section of the outer edge, the section extending along a direction in which the plurality of signal lines is opposed.

Although the excitation current tends to concentrate on the section extending along the direction in which the plurality of signal lines is opposed of the outer edge of the ground electrode, the above-described configuration can lead to a reduction in the excitation current and an enhancement of the isolation between the signal lines.

The ground electrode and the plurality of signal lines may be disposed on an electronic-component mounted surface of the circuit board.

Inflow of high-frequency signals on the electronic-component mounted surface of the circuit board can be suppressed, and the excitation current occurring in the other signal line resulting from the one signal line can be reduced. Accordingly, the isolation between the signal lines can be enhanced.

According to the present disclosure, the isolation between the plurality of signal lines on the circuit board can be enhanced.

BRIEF DESCRIPTION OF THE SEVERAL VIEWS OF THE DRAWINGS

FIG. 1 is a plan view of a portion of a circuit board in a comparative example.

FIG. 2 is a schematic perspective view of a high-frequency module using a circuit board according to a first embodiment.

DETAILED DESCRIPTION

Figure 3A:
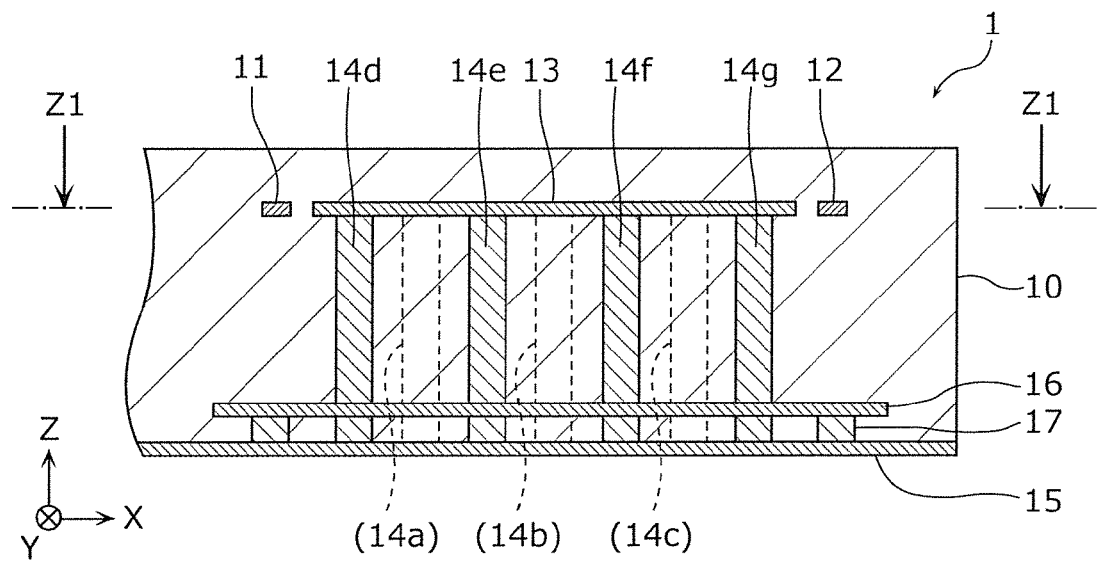
FIG. 3A is a cross-sectional view of a portion of the circuit board according to the first embodiment as seen from the front (cross-sectional view taken along Y1-Y1 in FIG. 2).

Embodiments of the present disclosure are described in detail below with reference to the drawings. The embodiments described below indicate comprehensive or specific examples. Numerical values, shapes, materials, constituent elements, arrangement and connection form of constituent elements, manufacturing steps, order of manufacturing steps, and the like illustrated in the embodiments below are examples and are not intended to limit the present disclosure. Among the constituent elements in the embodiments below, constituent elements that are not described in the independent claim are described as optional constituent elements. Sizes or ratios of sizes of constituent elements illustrated in the drawings may not necessarily be precise. In the embodiments below, "connected" includes not only being directly connected but also being electrically connected with another element or the like interposed therebetween.

First Embodiment

FIG. 2 is a schematic perspective view of a high-frequency module 5 incorporated in a cellular phone, mobile information terminal, or the like. A circuit board 1 is a constituent element of the high-frequency module 5 and includes signal lines for transmitting high-frequency signals. Implementation electronic components 6, including various chip components, a high-frequency filter, a transmission filter and reception filter as a diplexer, and a semiconductor device for power amplification, are mounted on the circuit board 1.

Figure 3B:
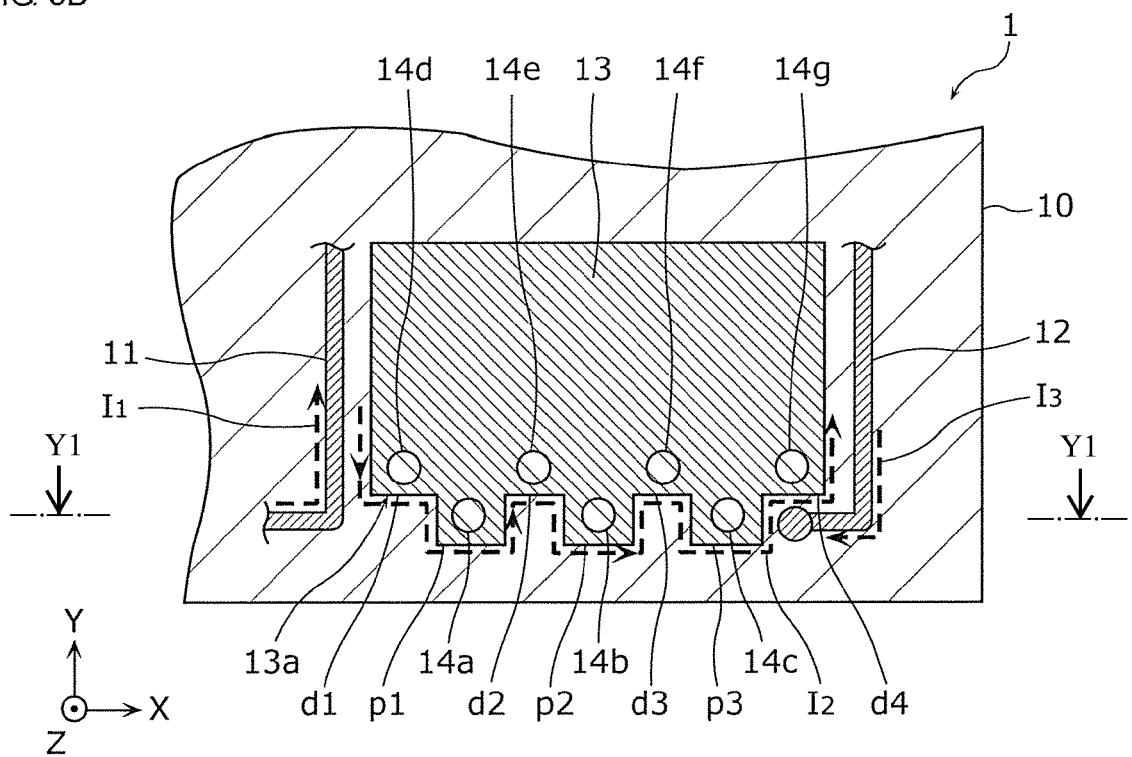
FIG. 3B is a cross-sectional view of a portion of the circuit board according to the first embodiment as seen from the above (cross-sectional view taken along Z1-Z1 in FIG. 3A).

FIG. 3A is a cross-sectional view of a portion of the circuit board 1 according to the present embodiment as seen from the front (cross-sectional view taken along Y1-Y1 in FIG. 2). FIG. 3B is a cross-sectional view of a portion of the circuit board 1 as seen from the above (cross-sectional view taken along Z1-Z1 in FIG. 3A). FIGS. 3A and 3B are illustrations in which an end portion of the circuit board 1 is extracted. In FIG. 3A and subsequent drawings, for the sake of simplification, constituent elements of the same type are illustrated with the same pattern, reference numerals thereof are omitted as needed, and constituent elements on different cross sections in the strict sense may sometimes be illustrated in the same drawing and described with reference thereto.

The circuit board 1 according to the present embodiment is a multilayer structure and includes a board body 10, a plurality of signal lines 11 and 12 for transmitting high-frequency signals, a ground electrode 13 disposed between the plurality of signal lines 11 and 12, and a plurality of via conductors 14 (14a to 14g) connected to the ground electrode 13. The ground electrode 13 is connected to a board ground 15 with the plurality of via conductors 14, an intermediate ground 16, and intermediate vias 17 interposed therebetween.

Electric elements, including an inductor, a capacitor, and a resistor, and interconnection wiring for connecting these electric elements are disposed inside the board body 10 (illustration is omitted). An example of the material of the board body 10 may be low temperature co-fired ceramics (LTCC).

The plurality of signal lines 11 and 12 is conductive lines disposed inside the board body 10 to electrically connect the electric elements and implementation electronic components 6 described above. In the present embodiment, as an example, the two signal lines 11 and 12 are opposed to each other in a predetermined plane (XY plane) and extend in parallel with each other in the X direction.

The ground electrode 13 is spaced apart from each of the two signal lines 11 and 12. The ground electrode 13 is a conductor having a predetermined thickness and a planar shape (flat shape) and extends in directions perpendicular to the lamination direction of the circuit board 1, which is a multilayer structure. The ground electrode 13 is at a location where the distance to each of the opposed signal lines 11 and 12 is the shortest. When the circuit board 1 is seen in plan view (viewed in a direction perpendicular to an extending surface of the planar shape of the ground electrode 13), the ground electrode 13 has a protruded and recessed area 13a, which outwardly projects and is inwardly recessed, in a section of its outer edge. As for "outwardly" and "inwardly" described here, for example, with respect to an imaginary straight line in a direction in which the outer edge of the ground electrode 13 extends, the direction in which the size of the ground electrode 13 decreases corresponds to inwardly, and the direction in which the size increases corresponds to outwardly.

Specifically, the ground electrode 13 has a substantially rectangular external shape, and a section of its outer edge that extends along the direction in which the signal lines 11 and 12 are opposed has a square-wave protruded and recessed shape. That is, the ground electrode 13 includes protruded portions p (p1, p2, p3) protruded to the negative side in the Y direction and recessed portions d (d1, d2, d3, d4) recessed to the positive side in the Y direction. The protruded portions p and recessed portions d are alternately aligned at the same pitch. An example dimension of the projection of each of the protruded portions p is 0.15 mm, an example width of the protruded portion p is 0.15 mm, an example width of each of the recessed portions d is 0.15 mm, and an example pitch between the protruded portion p and recessed portion d is 0.15 mm.

The via conductors 14 (14a to 14g) are cylindrical interlayer conductors in the board body 10. A first end of each of the via conductors 14 is connected to the ground electrode 13. A second end of each of the via conductors 14 is connected to the board ground 15, which is on the bottom surface side of the board body 10, with the intermediate ground 16 and intermediate vias 17, which are disposed inside the board body 10, interposed therebetween. The board ground 15 is grounded by wiring (not illustrated).

In the present embodiment, when the circuit board 1 is seen in plan view, the first end of each of the via conductors 14 is connected to the protruded and recessed area 13a in the ground electrode 13 so as to match with the protruded and recessed shape of the protruded and recessed area 13a. Specifically, the first ends of the via conductors 14a, 14b, and 14c are positioned in the centers of the protruded portions p1, p2, and p3, respectively, inside the protruded portions p of the ground electrode 13. The first ends of the via conductors 14d, 14e, 14f, and 14g are positioned inwardly from (on the positive side in the Y direction of) the recessed portions d of the ground electrode 13 and positioned in the centers of the recessed portions d1, d2, d3, and d4, respectively, in the X direction. Each of the via conductors 14 has a circular shape and has a diameter smaller than the dimension of the projection of the protruded portion p and its width. An example diameter of the via conductor 14 is 0.10 mm.

In the present embodiment, because the protruded portions p and recessed portions d of the ground electrode 13 are alternately aligned at the same pitch, the via conductors 14 are also arranged at the same pitch in the X direction and alternately positioned in a staggered arrangement in the Y direction.

Next, a method for manufacturing the circuit board 1 is described.

First, a plurality of ceramic green sheets is prepared. Then, a plurality of via holes is formed in each of the ceramic green sheets, the via holes are filled with conductive paste, and the ceramic green sheets having a plurality of via conductor patterns are formed.

Next, predetermined patterns are printed on one ceramic green sheet with the via conductor patterns by using the conductive paste, and a ground electrode pattern and a plurality of signal line patterns is formed thereon. The ground electrode pattern and the signal line patterns may be formed at the same time of filling the via holes with the conductive paste.

Predetermined patterns are printed on front and back sides of the other ceramic green sheets by using the conductive paste, and a board ground pattern, intermediate via patterns, and an intermediate ground pattern are formed thereon.

Next, these different kinds of ceramic green sheets are stacked in a predetermined order, they are laminated, and an unfired multilayer body block is formed. After that, the unfired multilayer body block is fired collectively, and the circuit board 1 having the signal lines 11 and 12, ground electrode 13, via conductors 14, board ground 15, intermediate ground 16, and intermediate vias 17 is manufactured.

Each of the signal lines 11 and 12, ground electrode 13, via conductors 14, board ground 15, intermediate ground 16, and intermediate vias 17 is made of a material having a high electric conductivity. Examples of such a material may include silver, copper, tin, nickel, gold, and alloys of elements selected from these metals.

In the present embodiment, as previously described, because the ground electrode 13 has the protruded and recessed area 13a in its outer edge, the length of the edge of the ground electrode 13 is increased. Thus, the length of a current path of an excitation current $I_2$ in the ground electrode 13 occurring with a current $I_1$ in the signal line 11 is increased.

Because the via conductors 14 are disposed so as to match with the protruded and recessed shape of the protruded and recessed area 13a, a section close to the via conductors 14 of the edge of the ground electrode 13 is increased. Thus, the current can escape from the current path of the excitation current $I_2$ through the via conductors 14, the excitation current $I_2$ flowing in the ground electrode 13 can be reduced, and an excitation current $I_3$ occurring in the signal line 12 can be reduced.

Accordingly, the isolation between the signal lines 11 and 12 can be enhanced.

Because the plurality of via conductors 14 is connected to the ground electrode 13 at the portions positioned inside the protruded portions p and positioned inwardly from the recessed portions d, the length of the current path close to the via conductors 14 of the current path of the excitation current $I_2$ is increased. Thus, the current can escape through the via conductors 14, and the excitation current $I_2$ flowing in the ground electrode 13 can be reduced. Accordingly, the excitation current $I_3$ occurring in the signal line 12 can be reduced, and the isolation between the signal lines 11 and 12 can be enhanced.

Because the protruded portions p and recessed portions d of the ground electrode 13 are alternately positioned at the same pitch, the excitation current $I_2$ can be appropriately dispersed and reduced. The occurrence of radiation noise and the like resulting from the excitation current $I_2$ can be suppressed.

The excitation current tends to concentrate on a section extending along the direction in which the signal lines 11 and 12 are opposed of the outer edge of the ground electrode 13. The excitation current $I_2$ can be reduced by the inclusion of the protruded and recessed area 13a in the portion extending along the direction in which the signal lines 11 and 12 are opposed. Accordingly, the isolation between the signal lines 11 and 12 can be enhanced.

Figure 4:
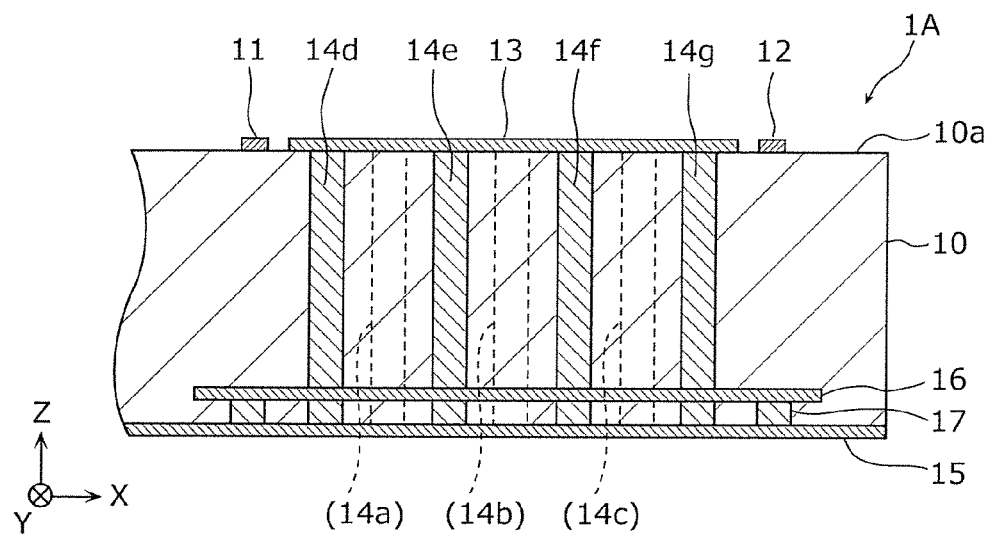
FIG. 4 is a cross-sectional view of a portion of a circuit board according to a variation of the first embodiment as seen from the front.

FIG. 4 is a cross-sectional view of a portion of a circuit board 1A according to a variation of the first embodiment as seen from the front. The circuit board 1A includes the two signal lines 11 and 12 and ground electrode 13 disposed on a principal surface 10a of the board body 10. The ground electrode 13 is connected to the board ground 15 with the plurality of via conductors 14, intermediate ground 16, and intermediate vias 17 interposed therebetween.

The implementation electronic components 6 are mounted on the principal surface 10a of the board body 10, and inflow of high-frequency signals tends to occur. Such inflow of high-frequency signals on the electronic-component mounted surface of the circuit board 1A can be suppressed by positioning the ground electrode 13 on the electronic-component mounted surface (principal surface 10a). Accordingly, the isolation between the signal lines 11 and 12 can be enhanced.

The outer edge of the intermediate ground 16 positioned inside the circuit board 1 and 1A may not have the protruded and recessed area 13a. Instead of having the protruded and recessed shape in the outer edge of the intermediate ground 16, by having a rectangular shape in the intermediate ground 16, constraints to arrangement of via conductors in design change are reduced.

Second Embodiment

Figure 5:
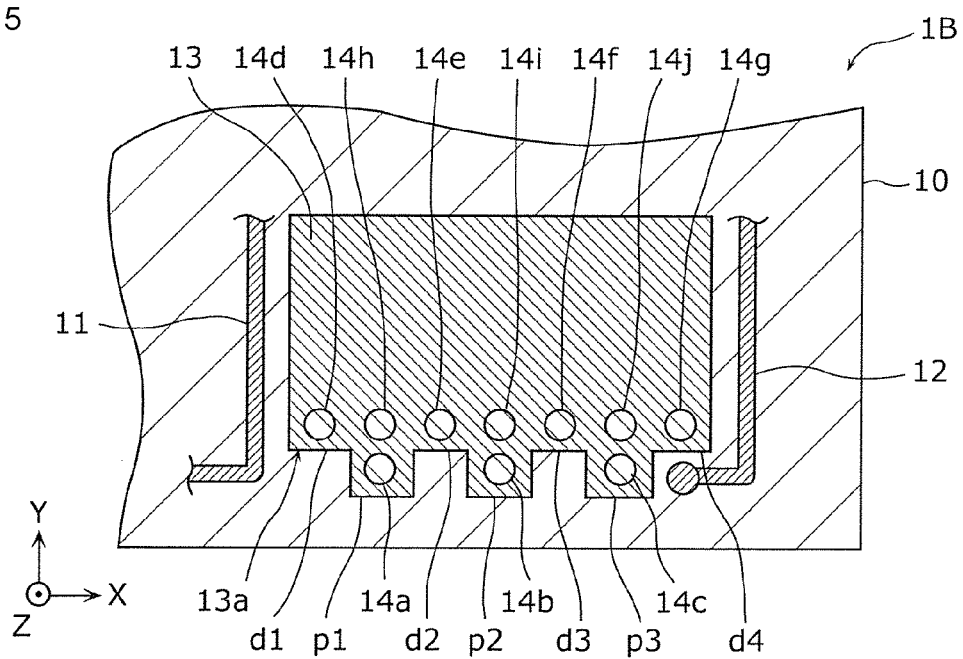
FIG. 5 is a cross-sectional view of a portion of a circuit board according to a second embodiment as seen from the above.

FIG. 5 is a cross-sectional view of a portion of a circuit board 1B according to a second embodiment as seen from the above. The circuit board 1B further includes via conductors 14 positioned inwardly from the protruded portions p. The same reference numerals are used for configurations common to those in the first embodiment, and the description thereof is omitted.

The circuit board 1B includes the board body 10, plurality of signal lines 11 and 12, ground electrode 13, and plurality of via conductors 14 (14a to 14j).

The circuit board 1B in the present embodiment includes the via conductors 14h to 14j, in addition to the above-described via conductors 14a to 14g. When the circuit board 1B is seen in plan view, these via conductors 14h to 14j are connected to the ground electrode 13 at the portions positioned inwardly from the protruded portions p. Specifically, the via conductors 14h, 14i, and 14j are positioned inwardly from (on the positive side in the Y direction of) the protruded portions p1, p2, and p3, respectively, and between the via conductors 14d and 14e, 14e and 14f, and 14f and 14g, respectively, which are positioned inwardly from the recessed portions d.

The via conductors 14 are arranged in a plurality of rows along a section of the outer edge of the ground electrode 13. Specifically, the via conductors 14a to 14j are arranged in two rows at one side of the ground electrode 13 extending along the direction in which the signal lines 11 and 12 are opposed.

With this structure, the length of the path close to the via conductors 14 of the current path of the excitation current $I_2$ flowing in the ground electrode 13 is further increased. Thus, the current can escape through the via conductors 14, and the excitation current $I_2$ flowing in the ground electrode 13 can be reduced. Accordingly, the excitation current $I_3$ occurring in the signal line 12 can be reduced, and the isolation between the signal lines 11 and 12 can be enhanced.

Next, variations of the second embodiment are described.

Figure 6:
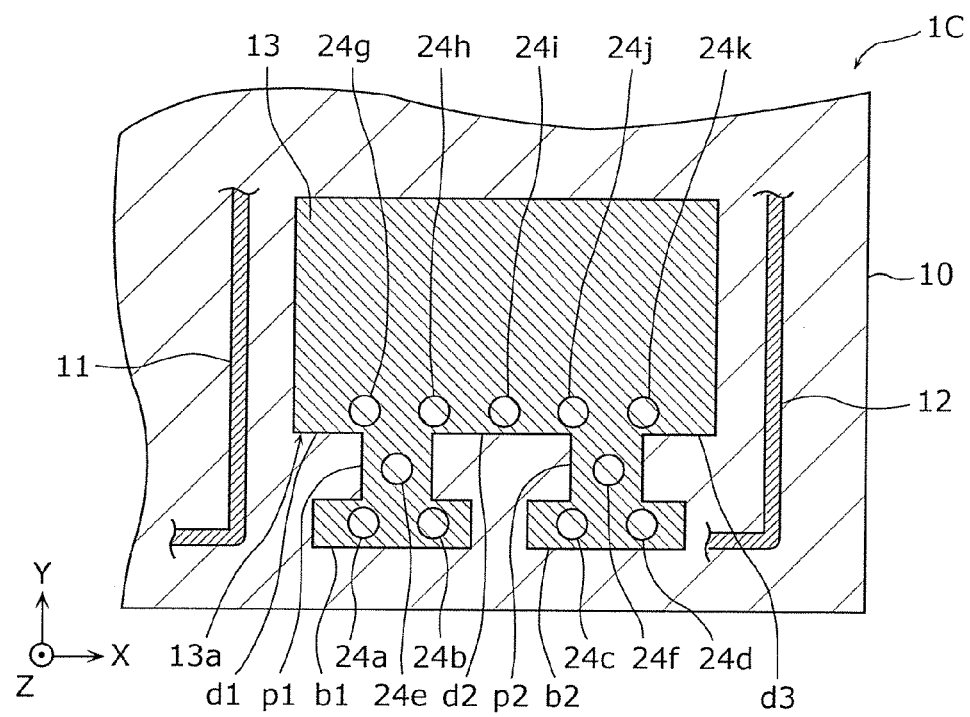
FIG. 6 is a cross-sectional view of a portion of a circuit board according to a first variation of the second embodiment as seen from the above.

FIG. 6 is a cross-sectional view of a portion of a circuit board 1C according to a first variation of the second embodiment as seen from the above. The circuit board 1C includes protrusions b1 and b2 having a sword guard shape in the leading ends of the protruded portions p1 and p2, respectively, of the ground electrode 13 on the negative side in the Y direction.

The circuit board 1C includes the board body 10, plurality of signal lines 11 and 12, ground electrode 13, and a plurality of via conductors 24 (24a to 24k).

The protrusion b1 is connected to the leading end of the protruded portion p1 of the ground electrode 13, and the protrusion b2 is connected to the leading end of the protruded portion p2. With this connection structure, the protruded and recessed area 13a is formed in a section of the outer edge of the ground electrode 13.

The via conductors 24a and 24b are aligned inside the protrusion b1. The via conductors 24c and 24d are aligned inside the protrusion b2. The via conductors 24e and 24f are positioned inside the protruded portions p1 and p2, respectively. The via conductors 24g to 24k are positioned inwardly from the recessed portions d1 to d3.

With this circuit board 1C, like the first embodiment, the isolation between the signal lines 11 and 12 can be enhanced.

Figure 7:
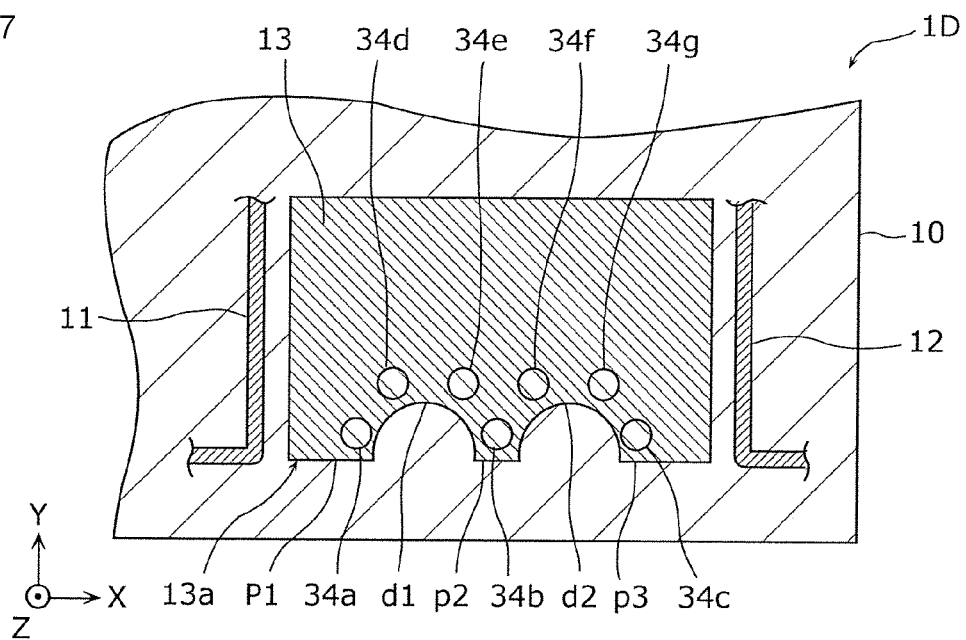
FIG. 7 is a cross-sectional view of a portion of a circuit board according to a second variation of the second embodiment as seen from the above.

FIG. 7 is a cross-sectional view of a portion of a circuit board 1D according to a second variation of the second embodiment as seen from the above. The ground electrode 13 in the circuit board 1D has sectorial cuts.

The circuit board 1D includes the board body 10, plurality of signal lines 11 and 12, ground electrode 13, and a plurality of via conductors 34 (34a to 34g).

The ground electrode 13 has two sectorial cuts. These sectorial cuts form the protruded and recessed area 13a in a section of the outer edge of the ground electrode 13. The via conductors 34a, 34b, and 34c are connected to the ground electrode 13 at the portions inside the protruded portions p1, p2, and p3, respectively. The two via conductors 34d and 34e are connected at the portions positioned inwardly from the recessed portion d1, and the two via conductors 34f and 34g are connected at the portions positioned inwardly from the recessed portion d2.

With this circuit board 1D, like the first embodiment, the isolation between the signal lines 11 and 12 can be enhanced.

The circuit boards according to the embodiments of the present disclosure and their variations are described above, and the present disclosure is not limited to the individual embodiments and their variations. Forms in which various modifications conceivable by those skilled in the art are made to the embodiments and their variations and forms created by combining constituent elements in different embodiments and their variations may be included in the scope of one or more aspects of the present disclosure.

For example, the present disclosure is not limited to the embodiments, in which the ground electrode has the protruded and recessed area in the direction in which the two signal lines are opposed (X direction) and the plurality of via conductors is arranged so as to match therewith. The ground electrode may have the protruded and recessed area in a direction in which the two signal lines extend (Y direction), and the plurality of via conductors may be arranged so as to match therewith.

The plurality of via conductors may be disposed in a single protruded portion. The plurality of via conductors may be arranged at different pitches.

The positions of the two signal lines and ground electrode are not limited to the end portion of the circuit board and may be the center of the circuit board. When the ground electrode is arranged between the two signal lines, the two signal lines and ground electrode may be disposed in different positions of the circuit board in the thickness direction (Z direction). If the circuit board includes three or more signal lines, the ground electrode may be positioned between signal lines opposed to each other.

INDUSTRIAL APPLICABILITY

The present disclosure can be widely used as circuit boards in high-frequency modules incorporated in wireless communication devices or other devices.

REFERENCE SIGNS LIST 1, 1A, 1B, 1C, 1D circuit board
5 high-frequency module
6 implementation electronic component
10 board body
10a principal surface of board body
11, 12 signal line
13 ground electrode
13a protruded and recessed area of ground electrode
14, 14a to 14j, 24, 24a to 24k, 34, 34a to 34g via conductor
15 board ground
16 intermediate ground
17 intermediate via
p, p1 to p4 protruded portion of ground electrode
d, d1 to d5 recessed portion of ground electrode

The invention claimed is:

1. A circuit board comprising:
a plurality of signal lines that transmits high-frequency signals;
a ground electrode positioned between the plurality of signal lines and spaced apart from each of the plurality of signal lines; and
a plurality of via conductors connected to the ground electrode,
wherein when the circuit board is seen in plan view, the ground electrode has a plurality of protruded portions and a plurality of recessed portions; and
wherein the plurality of protruded portions and the plurality of recessed portions are alternately arranged along a bottom edge of the ground electrode.

2. The circuit board according to claim 1, wherein the protruded and recessed portions are outwardly protruded and inwardly recessed, respectively, in a direction parallel to an extending direction of the signal lines.

3. The circuit board according to claim 1, wherein the plurality of via conductors is positioned in the protruded and recessed portions along a protruded and recessed shape of the bottom edge of the ground electrode.

4. The circuit board according to claim 1, wherein the plurality of via conductors includes via conductors positioned inside the protruded portions and via conductors positioned inwardly from the recessed portions, as seen in plan view.

5. The circuit board according to claim 4, wherein the plurality of via conductors further includes via conductors positioned outside the protruded portions and between the via conductors positioned inwardly from the recessed portions, as seen in plan view.

6. The circuit board according to claim 1, wherein the plurality of via conductors is arranged in a plurality of rows along the bottom edge of the ground electrode.

7. The circuit board according to claim 1, wherein the protruded portions and the recessed portions are alternately arranged at a same pitch.

8. The circuit board according to claim 1, wherein the plurality of signal lines is opposed in a predetermined plane, and
the protruded and recessed portions in the ground electrode are positioned in a section of the bottom edge, the section extending along a direction in which the plurality of signal lines is opposed.

9. The circuit board according to claim 1, wherein the ground electrode and the plurality of signal lines are disposed on an electronic-component mounted surface of the circuit board.

10. The circuit board according to claim 2, wherein the plurality of via conductors is arranged in a plurality of rows along the bottom edge of the ground electrode.

11. The circuit board according to claim 3, wherein the plurality of via conductors is arranged in a plurality of rows along the bottom edge of the ground electrode.

12. The circuit board according to claim 4, wherein the plurality of via conductors is arranged in a plurality of rows along the bottom edge of the ground electrode.

13. The circuit board according to claim 5, wherein the plurality of via conductors is arranged in a plurality of rows along the bottom edge of the ground electrode.

14. The circuit board according to claim 2, wherein the protruded portions and the recessed portions of the ground electrode are alternately arranged at a same pitch.

15. The circuit board according to claim 3, wherein the protruded portions and the recessed portions of the ground electrode are alternately arranged at a same pitch.

16. The circuit board according to claim 4, wherein the protruded portions and the recessed portions of the ground electrode are alternately arranged at a same pitch.

17. The circuit board according to claim 5, wherein the protruded portions and the recessed portions of the ground electrode are alternately arranged at a same pitch.

18. The circuit board according to claim 6, wherein the protruded portions and the recessed portions of the ground electrode are alternately arranged at a same pitch.

19. The circuit board according to claim 2, wherein the plurality of signal lines is opposed in a predetermined plane, and
the protruded and recessed portions in the ground electrode are positioned in a section of the bottom edge, the section extending along a direction in which the plurality of signal lines is opposed.

20. The circuit board according to claim 3, wherein the plurality of signal lines is opposed in a predetermined plane, and the protruded and recessed portions in the ground electrode are positioned in a section of the bottom edge, the section extending along a direction in which the plurality of signal lines is opposed.

21. The circuit board according to claim 1, wherein only a single via conductor is positioned in each of the protruded areas.

22. The circuit board according to claim 1, wherein a side of the ground electrode is comprised of the plurality of protruded portions and the plurality of recessed portions.

23. The circuit board according to claim 1, wherein the protruded portions and the recessed portions have a same width.

* * * * *